US009799734B2

(12) United States Patent
Ishigaki et al.

(10) Patent No.: US 9,799,734 B2
(45) Date of Patent: Oct. 24, 2017

(54) SEMICONDUCTOR DEVICE AND MANUFACTURING METHOD FOR SAME, AS WELL AS POWER CONVERSION DEVICE

(71) Applicant: HITACHI, LTD., Chiyoda-ku, Tokyo (JP)

(72) Inventors: Takashi Ishigaki, Tokyo (JP); Ryuta Tsuchiya, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 14/899,032

(22) PCT Filed: Jun. 17, 2013

(86) PCT No.: PCT/JP2013/066628
§ 371 (c)(1),
(2) Date: Dec. 16, 2015

(87) PCT Pub. No.: WO2014/203317
PCT Pub. Date: Dec. 24, 2014

(65) Prior Publication Data
US 2016/0133706 A1 May 12, 2016

(51) Int. Cl.
*H01L 29/739* (2006.01)
*H01L 21/04* (2006.01)
(Continued)

(52) U.S. Cl.
CPC .... *H01L 29/1608* (2013.01); *H01L 21/02378* (2013.01); *H01L 21/02529* (2013.01);
(Continued)

(58) Field of Classification Search
CPC ............. H01L 51/5275; H01L 51/5206; H01L 51/5262; H01L 51/56; H01L 51/5056;
(Continued)

(56) References Cited

U.S. PATENT DOCUMENTS 4,116,719 A * 9/1978 Shimizu ............... H01L 21/3105
148/DIG. 24
5,124,770 A * 6/1992 Umemoto ........... H01L 29/1075
257/192

(Continued)

FOREIGN PATENT DOCUMENTS

EP 0 837 508 A2 4/1998
JP 10-178174 A 6/1998
(Continued)

*Primary Examiner* — Benjamin Sandvik
*Assistant Examiner* — Gustavo Ramallo
(74) *Attorney, Agent, or Firm* — Miles & Stockbridge P.C.

(57) ABSTRACT

Provided is a vertical MOSFET in which a conduction deterioration phenomenon is prevented during a current return operation and an on-voltage is low during the current return operation. A semiconductor device includes a hole barrier region that is provided between a second-conductivity-type body region and a first-conductivity-type epitaxial layer below a second-conductivity-type body contact region and functions as a potential barrier to a hole which flows from a source electrode to the first-conductivity-type epitaxial layer through the second-conductivity-type body contact region and the second-conductivity-type body region.

12 Claims, 9 Drawing Sheets

(51) Int. Cl.
 *H01L 21/02* (2006.01)
 *H01L 29/16* (2006.01)
 *H01L 29/66* (2006.01)
 *H01L 29/78* (2006.01)
 *H01L 29/08* (2006.01)
 *H01L 29/10* (2006.01)
 *H01L 29/06* (2006.01)

(52) U.S. Cl.
 CPC ........ *H01L 21/046* (2013.01); *H01L 29/0865* (2013.01); *H01L 29/0878* (2013.01); *H01L 29/1095* (2013.01); *H01L 29/66068* (2013.01); *H01L 29/7397* (2013.01); *H01L 29/78* (2013.01); *H01L 29/7805* (2013.01); *H01L 29/7813* (2013.01); *H01L 29/0696* (2013.01)

(58) Field of Classification Search
 CPC ............. H01L 29/1608; H01L 29/0865; H01L 29/1095; H01L 29/66068; H01L 29/7397; H01L 29/78; H01L 29/7805; H01L 29/7813; H01L 21/02378; H01L 21/02529; H01L 21/046
 See application file for complete search history.

(56) References Cited

U.S. PATENT DOCUMENTS

| | | | |
|---|---|---|---|
| 5,773,340 A * | 6/1998 | Kumauchi | H01L 21/8249 148/DIG. 152 |
| 5,877,518 A * | 3/1999 | Sakurai | H01L 29/205 257/139 |
| 6,482,710 B2 * | 11/2002 | Oda | H01L 29/66242 257/581 |
| 6,809,373 B2 * | 10/2004 | Nishizaka | G11C 16/0475 257/315 |
| 7,630,043 B2 * | 12/2009 | Hattori | G02F 1/136213 349/138 |
| 8,962,490 B1 * | 2/2015 | Hung | H01L 21/76802 438/620 |
| 2004/0119076 A1 | 6/2004 | Ryu | |
| 2004/0164349 A1 | 8/2004 | Nishiwaki et al. | |
| 2005/0032287 A1 | 2/2005 | Nakazawa et al. | |
| 2005/0133794 A1 | 6/2005 | Hayashi et al. | |
| 2007/0158686 A1 * | 7/2007 | Rahimo | B67D 1/1422 257/197 |
| 2008/0315211 A1 * | 12/2008 | Ichikawa | H01L 21/0485 257/77 |
| 2011/0001166 A1 * | 1/2011 | Ogura | H01L 31/1123 257/187 |
| 2011/0012195 A1 * | 1/2011 | Momota | H01L 29/7815 257/334 |
| 2012/0248563 A1 * | 10/2012 | Udaka | H01L 51/0012 257/443 |
| 2015/0014742 A1 * | 1/2015 | Lu | H01L 29/7393 257/139 |

FOREIGN PATENT DOCUMENTS

| | | |
|---|---|---|
| JP | 2004-259934 A | 9/2004 |
| JP | 2004-327799 A | 11/2004 |
| JP | 2005-57049 A | 3/2005 |
| JP | 2005-183563 A | 7/2005 |
| JP | 2006-511961 A | 4/2006 |
| JP | 2009-164440 A | 7/2009 |

* cited by examiner

SEMICONDUCTOR DEVICE AND MANUFACTURING METHOD FOR SAME, AS WELL AS POWER CONVERSION DEVICE

TECHNICAL FIELD

The present disclosure relates to a semiconductor device and can be applied to, for example, a power conversion device.

BACKGROUND ART

In a high-voltage inverter device according to the related art which controls the driving of, for example, a motor, a pair of an insulated gate bipolar transistor (IGBT) and a p-intrinsic-n (PIN) diode, which are silicon (Si) elements and connected in inverse parallel, is provided in each of the upper and lower arms. The upper and lower IGBTs are alternately switched to generate an AC current as the output of the inverter device, thereby controlling the motor. During this operation, when the IGBT is turned on, a driving current flows through the IGBT. When the IGBT is turned off, a return current from the motor flows through the diode. In this case, conduction loss and switching loss occur in each of the IGBT and the diode, which causes the power conversion loss of the inverter device. The loss of the Si device at present is substantially equal to a theoretical value which is determined from the physical property value of Si and it is difficult to further reduce the loss.

SiC has a wider forbidden band width than silicon and the breakdown field of SiC is about one order of magnitude greater than that of silicon. Therefore, SiC is expected to be widely used for the next-generation power device. In particular, in a SiC vertical power metal oxide semiconductor field effect transistor (MOSFET), on-resistance is expected to be significantly reduced in a wide breakdown voltage range of several hundreds to several kilovolts, as compared to the silicon element according to the related art. In addition, since the MOSFET is a unipolar element unlike the IGBT, it can perform switching at a high speed. A PN diode which is called a body diode is provided in the structure of the vertical power MOSFET. Therefore, a return current can flow through the body diode, without using an inverse parallel diode. As a result, it is possible to form an inverter device using only the vertical power MOSFET and to reduce the number of components or the size of the inverter device, as compared to the Si inverter according to the related art.

However, in a SiC PN diode, when there is a stacking fault in the element, the stacking fault is grown by the recombination of electrons and holes during the turn-on of the diode. As a result, the lifetime of a hole which is conducted is reduced and the forward on-voltage of the PN diode increases (conduction deterioration occurs).

In contrast, in Patent Document 1, a region into which a recombination center is introduced is provided on a current path immediately after a semiconductor device is turned on. Therefore, a chance of the recombination of electrons and holes due to the stacking fault is reduced and the growth of the stacking fault and conduction deterioration are prevented.

CITATION LIST

Patent Document

Patent Document 1: JP 2009-164440 A

SUMMARY OF THE INVENTION

Problems to be Solved by the Invention

However, in the semiconductor device disclosed in Patent Document 1, when there is a stacking fault in the vicinity of the region in which the recombination center has been introduced, the growth of the stacking fault is accelerated. As a result, conduction deterioration is likely to be accelerated.

In general, the region in which the recombination center has been introduced has low crystallinity and has a plurality of carrier trap levels. Therefore, the following various problems are likely to occur: the breakdown voltage is significantly lower than a value which is expected from the physical property value of SiC; the forward current of the PN diode is significantly reduced; a transient response is delayed; and hysteresis occurs.

An object of the disclosure is to provide a semiconductor device which prevents conduction deterioration in a body diode and has good current return characteristics.

Solutions to Problems

The outline of a representative structure of the disclosure will be described in brief as follows.

A semiconductor device includes a hole barrier region that is provided between a second-conductivity-type body region and a first-conductivity-type epitaxial layer below a second-conductivity-type body contact region and functions as a potential barrier to a hole which flows from a source electrode to the first-conductivity-type epitaxial layer through the second-conductivity-type body contact region and the second-conductivity-type body region.

Effects of the Invention

According to the above-mentioned semiconductor device, it is possible to prevent a conduction deterioration phenomenon during a current return operation and to obtain good characteristics in the current return operation.

MODES FOR CARRYING OUT THE INVENTION

Figure 1A:
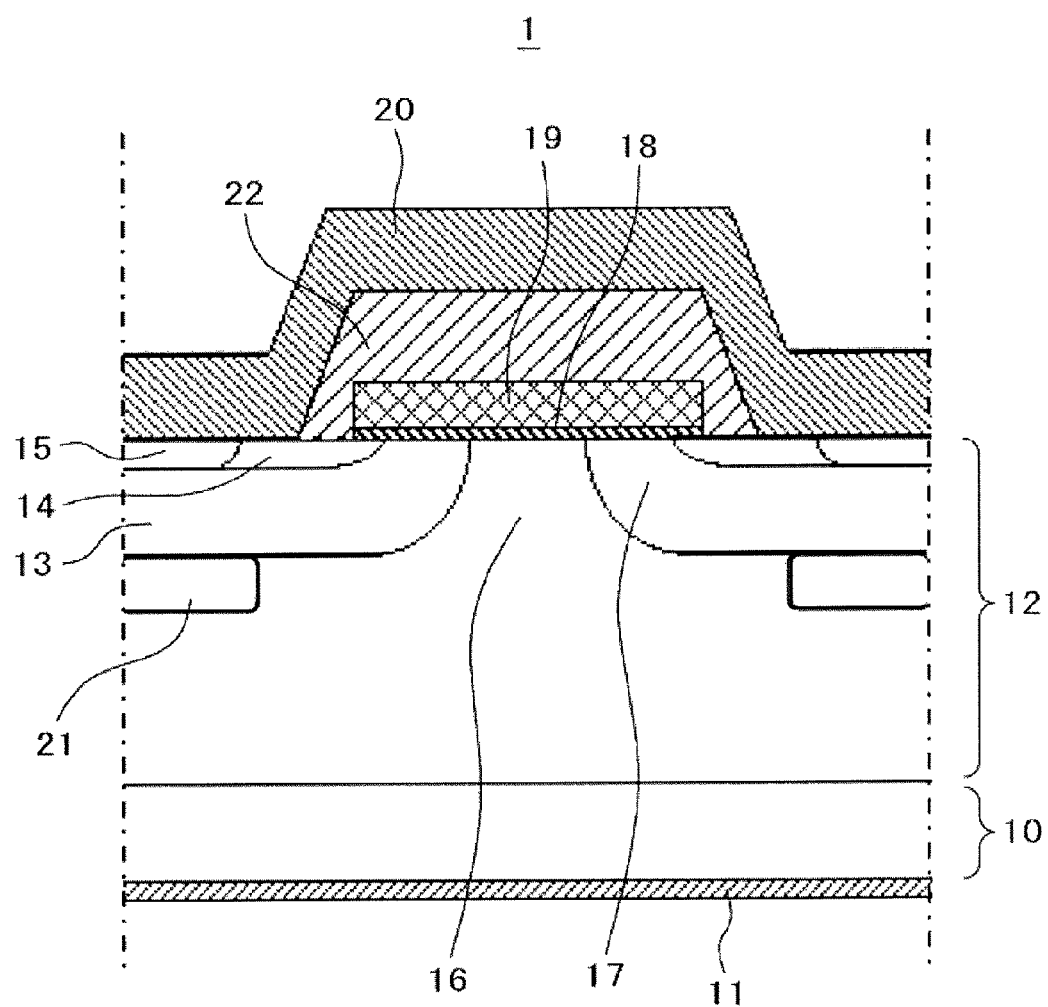
FIG. 1A is a diagram illustrating the cross-sectional structure of a semiconductor device according to Embodiment 1.

The outline of an embodiment will be described in brief as follows.

A semiconductor device (1) includes: a first-conductivity-type semiconductor substrate (10); a first-conductivity-type epitaxial layer (12) that is provided on the first-conductivity-type semiconductor substrate (10); a second-conductivity-type body region (13) that is formed in a predetermined portion of a surface of the first-conductivity-type epitaxial layer (12); a first-conductivity-type source region that is formed in a predetermined portion of a surface of the second-conductivity-type body region (13); a second-conductivity-type body contact region (15) that is provided in a predetermined portion of the surface of the second-conductivity-type body region (13); a source electrode (20) that is formed on the first-conductivity-type source region (14) and the second-conductivity-type body contact region (15); and a hole barrier region (21) that is provided between the second-conductivity-type body region (13) and the first-conductivity-type epitaxial layer (12) below the second-conductivity-type body contact region (15) and functions as a potential barrier to a hole which flows from the source electrode (20) to the first-conductivity-type epitaxial layer (12) through the second-conductivity-type body contact region (15) and the second-conductivity-type body region (13).

According to the above-mentioned semiconductor device, it is possible to suppress a hole current using the hole barrier region during a current return operation. For an electron current during the current return operation, it is possible to suppress the recombination of electrons and holes in the body region and to obtain return current characteristics with a low on-voltage. In addition, it is possible to prevent a conduction deterioration phenomenon during the current return operation of the semiconductor device.

Hereinafter, embodiments and modifications will be described in detail with reference to the drawings. In all of the drawings for describing the embodiments and the modifications, in principle, the same members are denoted by the same reference numerals and the description thereof will not be repeated.

Embodiment 1

Figure 1B:
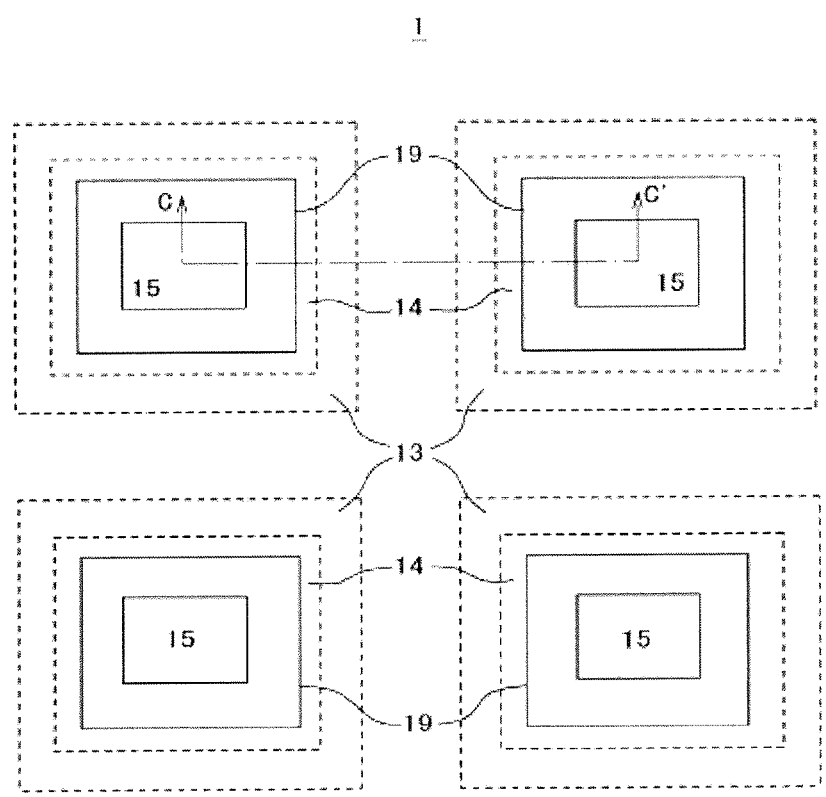
FIG. 1B is a diagram illustrating the planar structure of the semiconductor device according to Embodiment 1.

FIG. 1A is a diagram illustrating the cross-sectional structure of a semiconductor device according to Embodiment 1. FIG. 1B is a diagram illustrating the planar structure of the semiconductor device according to Embodiment 1. FIG. 1A is a cross-sectional view taken along the line C-C' of FIG. 1B. FIG. 1B is a top view from which a source electrode 20 and an interlayer insulating film 22 illustrated in FIG. 1A are removed.

A semiconductor device 1 according to this embodiment includes a drain electrode 11 which is provided on a lower surface of an $n^+$ (first conductivity type) SiC substrate 10, an n (first conductivity type) epitaxial layer 12 which is formed on an upper surface of the $n^+$ (first conductivity type) SiC substrate 10, and a p-type (second conductivity type) body region 13 which is selectively formed in the surface of the $n^-$ (first conductivity type) epitaxial layer 12. In addition, the semiconductor device 1 includes an $n^+$ (first conductivity type) source region 14 and a p+ (second conductivity type) body contact region 15 which are selectively provided in a surface portion of the p-type (second conductivity type) body region 13 and a channel region 17 which is provided in the surface portion of the body region 13 so as to be adjacent to the source region 14. The semiconductor device 1 further includes a gate electrode 19 which is provided above the channel region 17, with a gate insulating film 18 interposed therebetween, and a source electrode 20 which is formed on the source region 14 and the body contact region 15. The semiconductor device 1 further includes a hole barrier layer 21 which is provided below the body contact region 15 and prevents the flow of holes from the source electrode 20 to the epitaxial layer 12 through the body contact region 15 and the body region 13. The semiconductor device 1 forms a vertical MOSFET. For example, the concentration of the $n^-$ epitaxial layer 12 is in the range of $10^{15}/cm^3$ to $10^{16}/cm^3$ and the concentration of the p-type body region 13 is in the range of $10^{17}/cm^3$ to $10^{18}/cm^3$, the concentration of the $n^+$ source region 14 is in the range of $10^{19}/cm^3$ to $10^{20}/cm^3$, and the concentration of the p-type body contact region 15 is in the range of $10^{19}/cm^3$ to $10^{20}/cm^3$.

In this embodiment, the interlayer insulating film 22 is formed on the gate electrode 19 and the source electrode 20 on the interlayer insulating film 22 is electrically separated from the gate electrode 19. The source electrode 20 is electrically connected to the source region 14 and the body contact region 15 through a source contact hole which is formed in the interlayer insulating film 22 on the source region 14 and the body contact region 15. The semiconductor device 1 includes a plurality of cells which are periodically arranged in parallel. FIG. 1A illustrates one cell of the semiconductor device 1.

Next, the operation of the semiconductor device 1 will be described. The semiconductor device 1 forms the vertical MOSFET (vertical power MOSFET). When the vertical MOSFET is turned on, a positive bias is applied between the gate electrode 19 and the source electrode 20 (VGS>0 V). In this case, an inversion layer (channel) including electrons is formed in the channel region 17 below the gate electrode 19 and the voltage applied between the source electrode 20 and the drain electrode 11 causes an electron, which is a carrier, to flow between the source electrode 20 and the drain electrode 11 through the source region 14, the channel region 17, an $n^-$ (first conductivity type) JFET region 16 which is provided between adjacent body regions 13, the $n^-$ epitaxial layer 12 which will be a drift layer, and the SiC substrate 10.

Figure 2:
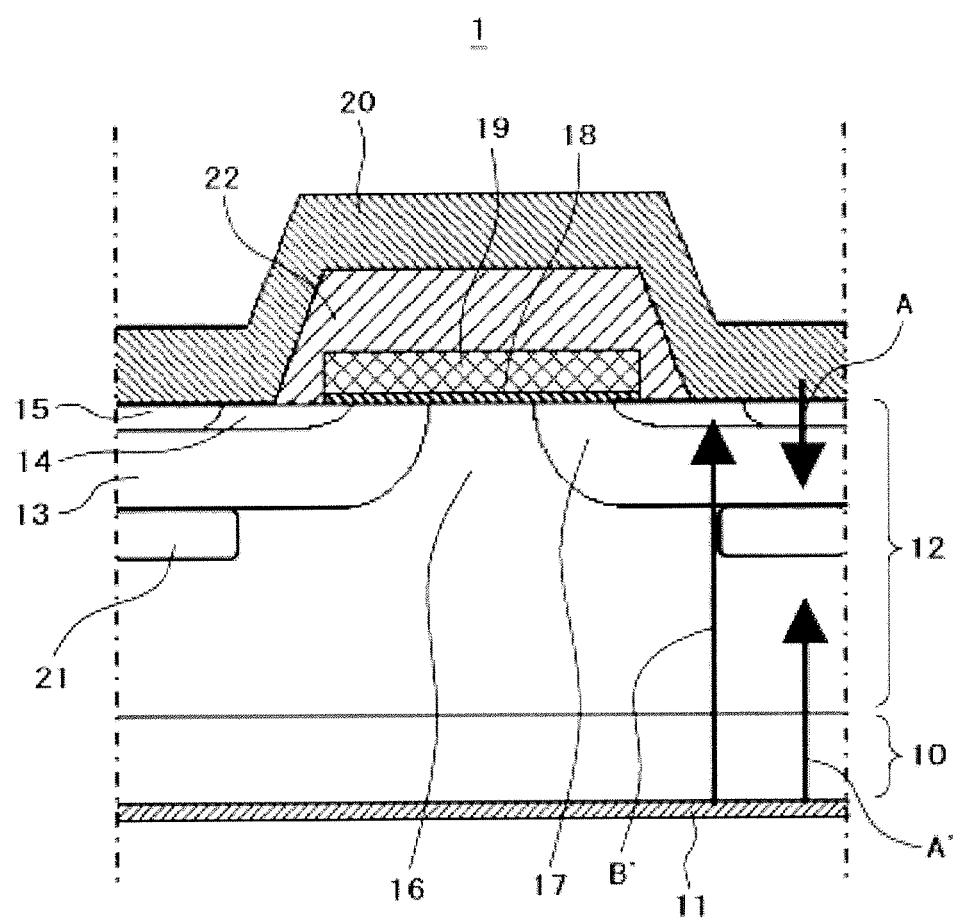
FIG. 2 is a diagram illustrating a current path during a current return operation in FIG. 1.
Figure 3:
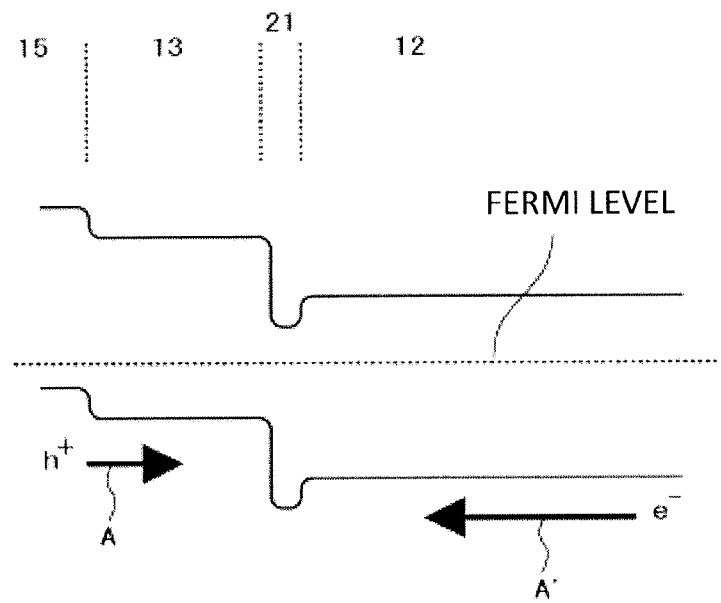
FIG. 3 is an energy band diagram along the line A-A' of FIG. 2.

During the current return operation, the vertical MOSFET is in an off state (VGS≤0 V) and no channel is formed. FIG. 2 is a diagram illustrating a current path during the current return operation. During the current return operation, a positive voltage is applied from the drain to the source (VSD>0 V) and a hole ($h^+$) flows from the source electrode 20 to the epitaxial layer 12 through the body contact region 15 and the body region 13, as represented by a current path A in FIG. 2. The path A indicates a hole current, a path A' indicates an electron current, and a path B' indicates an electron current. FIG. 3 is a band diagram along the current paths A and A' illustrated in FIG. 2 when no bias is applied (VSD=0 V). Here, the hole barrier layer 21 is doped with, for example, n-type (first conductivity type) impurities with a higher concentration than the $n^-$ epitaxial layer 12 and functions as a barrier which prevents the outflow of the hole ($h^+$). Therefore, it is possible to prevent electrical conduction caused by the hole carrier and to prevent conduction deterioration. For example, the concentration of the hole barrier layer 21 is in the range of $10^{17}/cm^3$ to $10^{19}/cm^3$.

Figure 4:
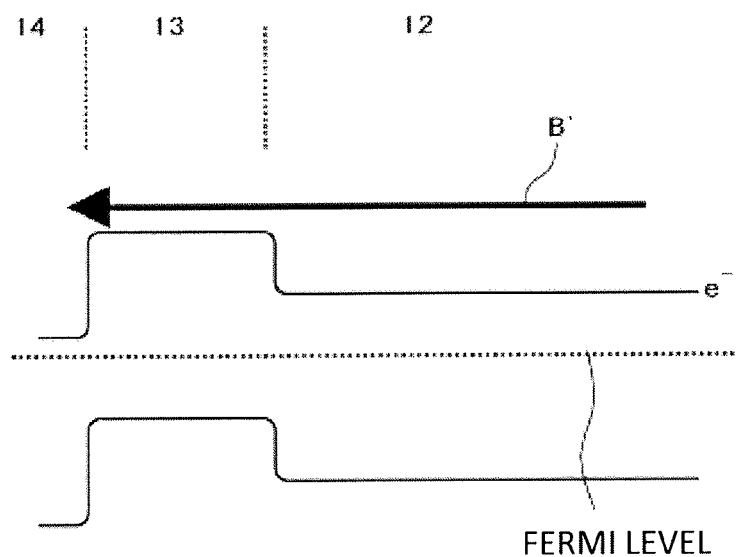
FIG. 4 is an energy band diagram along the line B' of FIG. 2.

FIG. 4 is a band diagram along the current path B' illustrated in FIG. 2 when no bias is applied (VSD=0 V). When VSD>0 V is satisfied during the current return operation, an electron (e⁻) flows from the drain electrode 11 to the source region 14 through the SiC substrate 10 and the epitaxial layer 12. Here, in the p-type body region 13 below the path B', when the concentration of p-type impurities is low or when the path length of a p-type region is short, the electron (e⁻) which flows from the epitaxial layer 12 to the body region 13 is not recombined with the hole (h⁺) in the p-type body region 13 and can reach the source region 14. When the sufficient amount of current in the path is ensured, it is possible to obtain good current return characteristics with a low on-voltage even though the hole current is suppressed. In addition, since the current in the path is the electron current, the problem of conduction deterioration does not occur.

Modification

Figure 5:
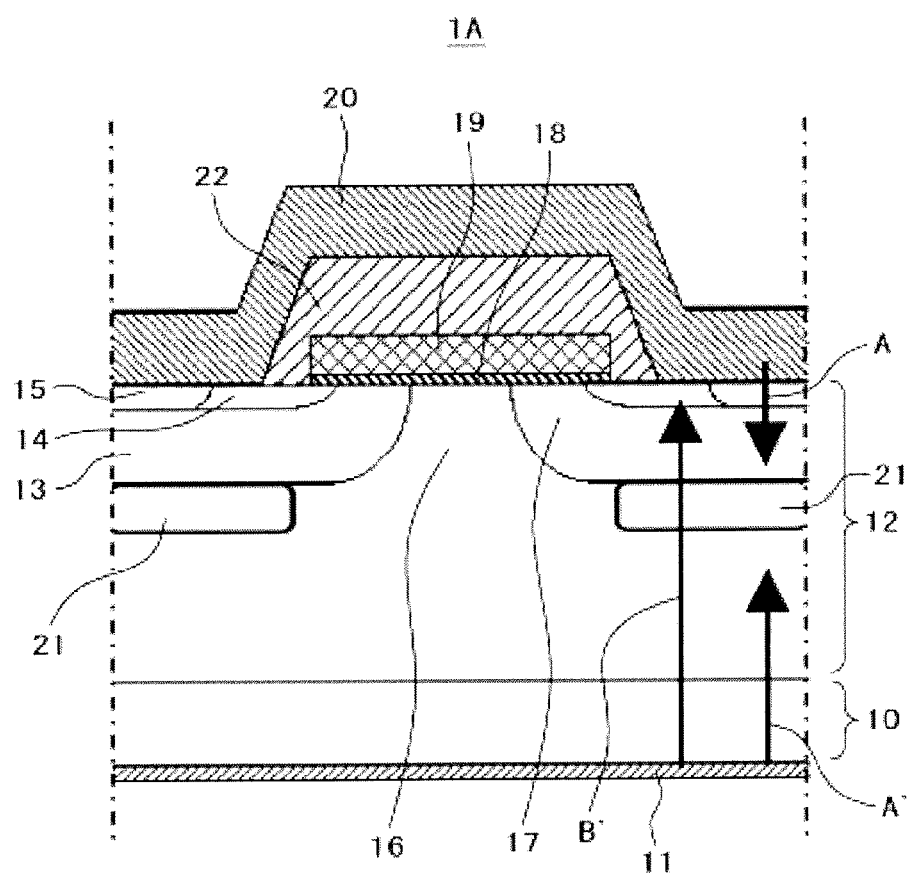
FIG. 5 is a diagram illustrating the cross-sectional structure of a semiconductor device according to a modification of Embodiment 1.
Figure 6:
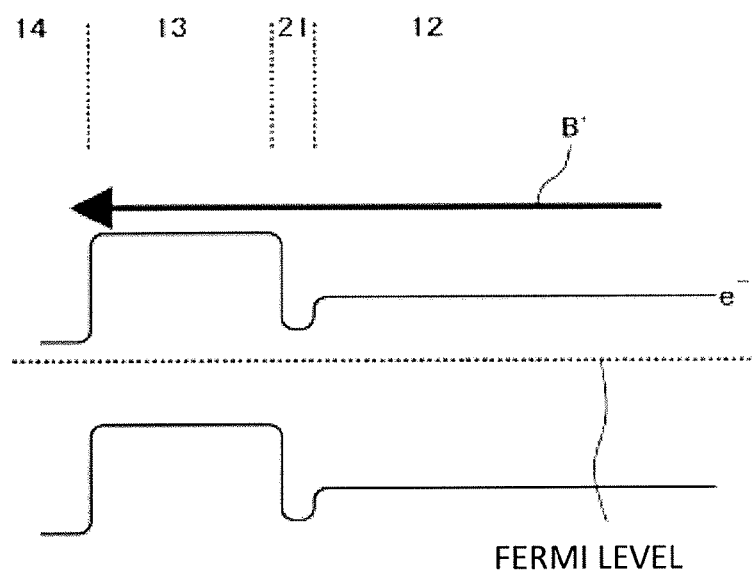
FIG. 6 is an energy band diagram along the line B' of FIG. 5.

FIG. 5 is a diagram illustrating the cross-sectional structure of a semiconductor device according to a modification. A semiconductor device 1A includes a hole barrier layer 21 which extends below the path B'. FIG. 6 is a band diagram along the current path B' when no bias is applied (VSD=0 V). When the hole barrier layer 21 is doped with n-type impurities with a higher concentration than the n⁻ epitaxial layer 12, the amount of electron diffusion current which flows to the p-type body region 13 below the path B' increases and the amount of electron drift current caused by the electric field also increases. Therefore, it is possible to ensure the electron current. Here, the hole barrier layer is formed below the p-type body region 13. However, an upper portion of the hole barrier layer 21 may extend into the p-type body region 13. Since the current in the path is the electron current, the problem of conduction deterioration does not occur.

According to the above-mentioned structure, during the current return operation (VSD>0 V), the flow of the hole current through the path A is prevented by the hole barrier layer 21. Therefore, it is possible to prevent conduction deterioration and to prevent the recombination of electrons and holes in the p-type body region 13 below the path B'. As a result, it is possible to ensure the electron current, that is, to obtain good current return characteristics with a low on-voltage.

Manufacturing Method

Next, a process of manufacturing the semiconductor devices according to this embodiment and the modification will be described. First, the n⁺ SiC substrate 10 is prepared. The n⁻ epitaxial layer 12 is formed on the n⁺ SiC substrate 10 by epitaxial growth. Then, for example, aluminum (Al) ions are implanted into a predetermined region of a surface layer of the n⁻ epitaxial layer 12 by a photolithography technique to form the p-type body region 13. Here, for example, boron (B) other than Al may be implanted as the p-type impurities. Similarly, the n⁺ source region 14 and the p⁺ body contact region 15 are formed in a predetermined region of the surface layer of the p-type body region 13 by the photolithography and an ion implantation technique. For example, nitrogen (N) or phosphorus (P) is used as n-type ion implantation impurities.

Here, during ion implantation for forming the p⁺ body contact region 15, n-type ion implantation with higher energy is added to form the hole barrier layer 21 below the p⁺ body contact region 15. In this case, when ion implantation is performed in an oblique direction, it is possible to form the structure according to the modification illustrated in FIG. 5 in which the hole barrier layer 21 extends in the left-right direction. Alternatively, as another method for forming the structure according to the modification illustrated in FIG. 5, during ion implantation for forming the n⁺ source region 14, n-type ion implantation with higher energy may be added. However, it is preferable that the hole barrier layer 21 illustrated in FIG. 5 not extend to an end portion of the p-type body region 13 close to the JFET region 16. The end portion of the p-type body region 13 is a portion in which the electric field is high due to the concentration of the electric field when the MOSFET is in the off state and a high voltage is maintained. Therefore, when the hole barrier layer 21 extends to the end portion, the breakdown voltage is reduced.

After the ion implantation process, for example, a heat treatment is performed at a temperature of about 1700° C. to activate the implanted impurities.

Then, for example, an insulating film with a thickness of about a few tens of nanometers is formed on the surface of the epitaxial layer 12 by a thermal oxidation method or a chemical vapor deposition (CVD) method. Then, for example, polysilicon heavily doped with P or B is deposited on the insulating film by the CVD method and the insulating film and the polysilicon are processed by a photolithography technique and a dry etching technique to form the gate insulating film 18 and the gate electrode 19 in a predetermined region. The gate insulating film 18 is, for example, a $SiO_2$ film, a SiON film, an $Al_2O_3$ film, a $HfO_2$ film, or a stacked film thereof.

Then, the interlayer insulating film 22 is deposited by, for example, the CVD method. Then, a predetermined region of the interlayer insulating film 22 is processed by photolithography and the dry etching technique to form a source contact hole. In addition, a metal film, such as an Al film, is deposited by, for example, the CVD method, a vapor deposition method, or a sputtering method to form the source electrode 20. Similarly, a metal film, such as a titanium (Ti) film, a nickel (Ni) film, a gold (Au) film, a silver (Ag) film, or a stacked film thereof, is deposited on the lower surface of the SiC substrate 10 to form the drain electrode 11.

Finally, a passivation film is deposited and a pad region for applying a bias to each electrode from the outside is formed in the passivation film, which is not illustrated in the drawings. In this way, the semiconductor devices 1 and 1A according to the embodiment and the modification are completed.

Embodiment 2

In Embodiment 1, the electron which passes through the channel region from the source when the semiconductor device is turned on needs to pass through the JFET region 16 which is provided in the relatively narrow surface portion of the n⁻ epitaxial layer 12 between adjacent p-type body regions 13. The resistance of the region is relative high, which causes an increase in the resistance of the vertical MOSFET.

When the width of the JFET region (in the left-right direction in the drawings) increases in order to reduce the on-resistance, the width of one cell, that is, the pitch between the cells which are periodically arranged increases. In this case, the number of cells to be arranged in a chip with a given size is reduced, which is equivalent to an increase in the resistance of the semiconductor device. The increase in the cell pitch leads to an increase in resistance during the current return operation.

Figure 7:
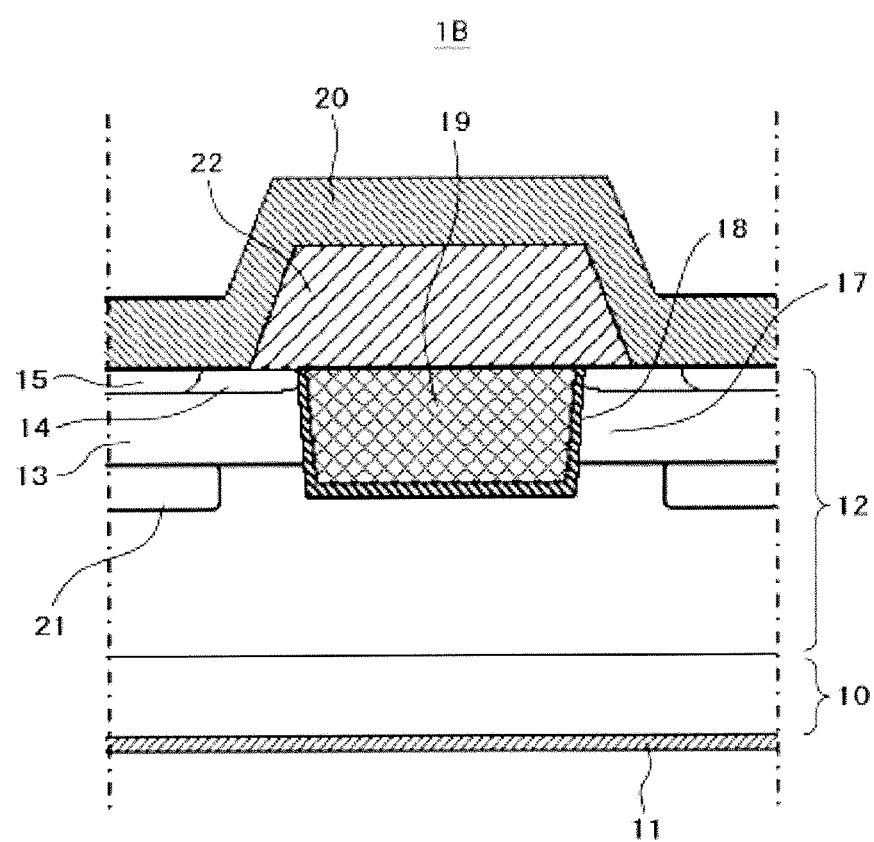
FIG. 7 is a diagram illustrating the cross-sectional structure of a semiconductor device according to Embodiment 2.

In this embodiment, an example of a semiconductor device with lower on-resistance in a vertical MOSFET will be described. FIG. 7 is a diagram illustrating the cross-sectional structure of the semiconductor device according to Embodiment 2. In this embodiment, components having the same functions as those in Embodiment 1 are denoted by the same reference numerals and the description thereof will not be repeated.

A semiconductor device 1B according to this embodiment is characterized in that a gate insulating film 18 and a gate electrode 19 are buried in a trench (groove) portion which is formed in an epitaxial layer 12, unlike Embodiment 1. Hereinafter, a manufacturing process will be sequentially described.

Similarly to Embodiment 1, an n⁻ epitaxial layer 12 is formed on an n⁺ SiC substrate 10. Then, a p-type body region 13, an n⁺ source region 14, a p body contact region 15, and a hole barrier layer 21 are formed by ion implantation and a heat treatment is performed to activate impurities.

Then, a predetermined region of a surface portion of the epitaxial layer 12 is processed by photolithography and a dry etching technique to form a trench region.

Then, similarly to Embodiment 1, for example, an insulating film with a thickness of a few tens of nanometers is formed on the surface of the epitaxial layer 12 including the surface of the trench region by a thermal oxidation method or a CVD method. Then, polysilicon doped with, for example, P or B is deposited on the insulating film by the CVD method. In this case, it is preferable that the polysilicon of the trench region portion be formed so as to seamlessly cover the bottom and side wall of the trench.

In addition, the insulating film and the polysilicon are processed by the photolithography and the dry etching technique to form a gate insulating film 18 and a gate electrode 19 in a predetermined region.

Then, an interlayer insulating film 22, a source contact hole, a source electrode 20, and a drain electrode 11 are formed through the same process as that in Embodiment 1. In this way, the semiconductor device 1B according to this embodiment is completed.

In this embodiment, a JFET region is not provided between adjacent p-type body regions 13. When the vertical MOSFET according to this embodiment is turned on, the p-type body region 13 which is provided on the side surface of the trench portion, with the gate insulating film 18 interposed therebetween, is changed to a channel region 17 by a positive bias applied to the gate electrode 19 and an inversion layer channel is formed.

Since electrons which pass through the channel directly flow to the n-type epitaxial layer 12, it is possible to further reduce on-resistance.

The width of the trench is reduced to reduce the pitch between cells. Therefore, it is possible to reduce resistance during the current return operation.

According to this structure, similarly to Embodiment 1, it is possible to suppress a hole current using the hole barrier layer 21 and thus to prevent the problem of conduction deterioration.

Embodiment 3

In Embodiment 1 and Embodiment 2, the hole barrier layer 21 is provided at the boundary between the body region 13 and the epitaxial layer 12 below the body contact region 15. When the MOSFET is in an off state and a high voltage is maintained, the intensity of the electric field is high at the interface between the p-type body region 13 and the n⁻ epitaxial layer 12 which is the boundary of a PN junction. In Embodiment 1 and Embodiment 2, since the n-type impurity concentration of the hole barrier layer 21 is higher than that of the n⁻ epitaxial layer 12, there is a problem that the intensity of the electric field of the PN junction below the body contact region 15 is high.

Figure 8:
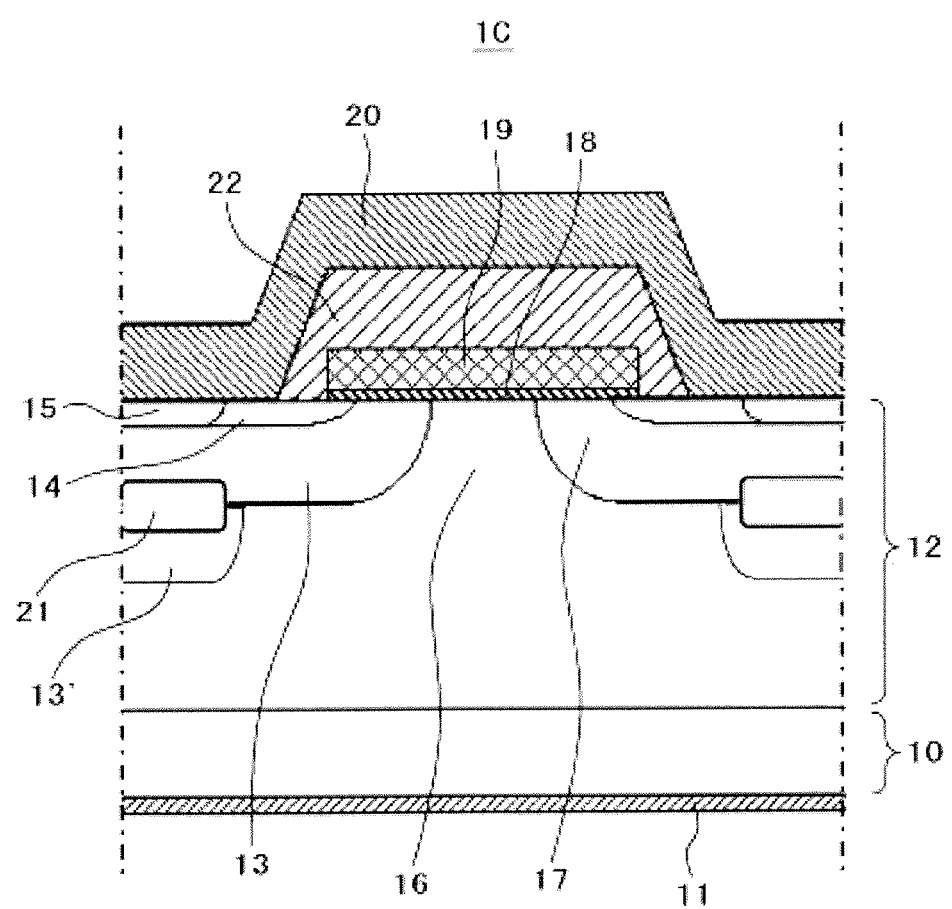
FIG. 8 is a diagram illustrating the cross-sectional structure of a semiconductor device according to Embodiment 3.

This embodiment is characterized in that a hole barrier layer 21 is provided in a body region 13 below a body contact region 15. FIG. 8 is a diagram illustrating the cross-sectional structure of a semiconductor device according to Embodiment 3. In this embodiment, components having the same functions as those in Embodiments 1 and 2 are denoted by the same reference numerals and the description thereof will not be repeated.

In a semiconductor device 1C according to this embodiment, the p-type body region 13 extends below the hole barrier layer 21 (p-type body region 13'). Therefore, when a high voltage is maintained, the intensity of the electric field is high at the interface between the p-type body region 13' and an n⁻ epitaxial layer 12. The intensity of the electric field can be lower than that in Embodiment 1 and Embodiment 2. For holes which flow from a source electrode 20 through the body contact region 15, a hole current can be suppressed by the hole barrier layer 21, similarly to Embodiment 1 and Embodiment 2.

Since the body region 13 below the source region 14 has the same structure as that in Embodiment 1, it is possible to ensure the sufficient amount of electron current through a path B'.

Next, a manufacturing process will be sequentially described.

Similarly to Embodiment 1, the n⁻ epitaxial layer 12 is formed on an n⁺ SiC substrate 10. Then, the p-type body region 13, an n-type source region 14, and the p-type body contact region 15 are formed by ion implantation. Here, when the p-type body contact region 15 is formed, the hole barrier layer is formed by n-type ion implantation with high energy, similarly to Embodiment 1. In this embodiment, p-type ion implantation with higher energy is added and an additional p-type body region 13' is formed below the hole barrier layer 21. In this case, it is preferable that the addition p-type body region 13' not extend below the source region 14. When the p-type body region 13 below the source region 14 is deeply formed, the amount of electron current is reduced during the current return operation.

Then, a heat treatment is performed to activate impurities and a gate insulating film 18 and a gate electrode are formed similarly to Embodiment 1. In addition, an interlayer insulating film 22, a source contact hole, a source electrode 20, and a drain electrode 11 are formed through the same process as that in Embodiment 1. In this way, the semiconductor device 1C according to this embodiment is completed.

Embodiment 4

Figure 9:
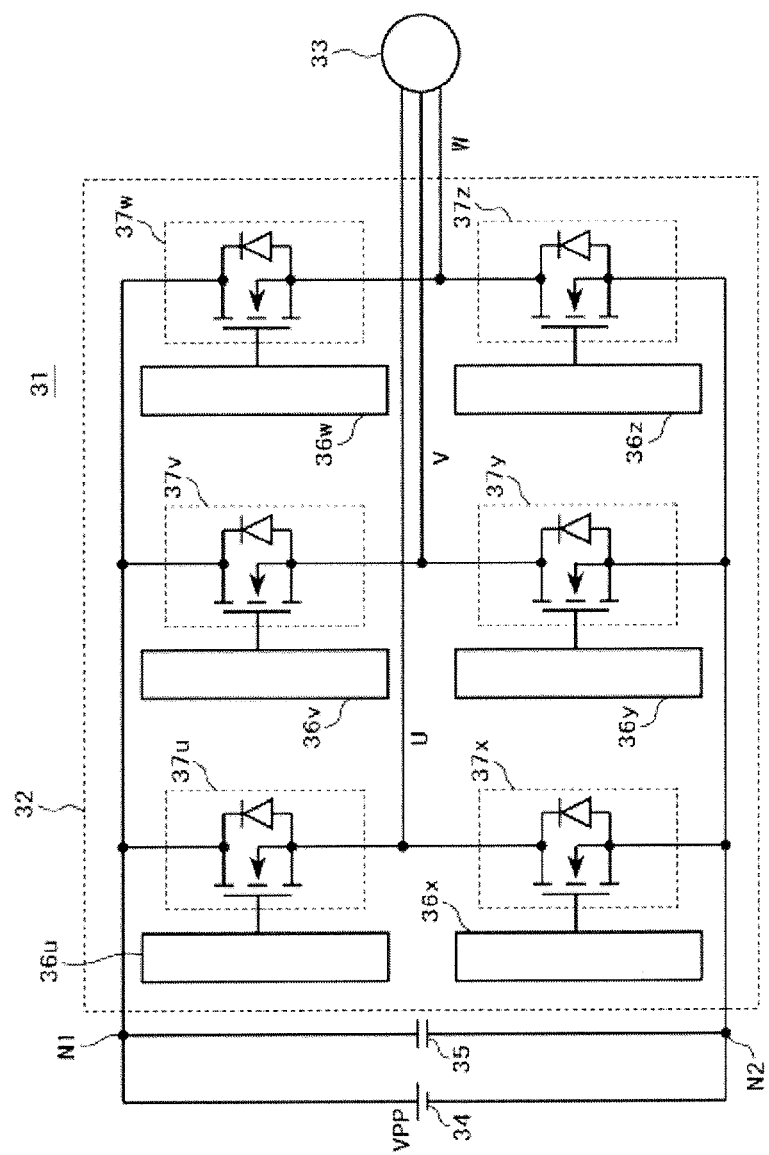
FIG. 9 is a diagram schematically illustrating the structure of a power conversion device according to Embodiment 4.

FIG. 9 is a diagram schematically illustrating the structure of a power conversion device according to Embodiment 4. A power conversion device 31 includes a three-phase inverter device 32 using the semiconductor device according to Embodiments 1 to 3 and the modification, a load circuit 33, such as a motor, a power supply 34, and a capacitor 35. In FIG. 9, each of switching elements 37u, 37v, 37w, 37x, 37y, and 37z is formed by the semiconductor device 1, 1A, 1B, or 10. The switching elements 37u, 37v, and 37w are provided in an upper arm and the switching elements 37x, 37y, and 37z are provided in a lower arm. The switching elements 37u and 37x are used for the U-phase, the switching elements 37v and 37y are used for the V-phase, and the switching elements 37w and 37z are used for the W-phase.

Gate driving circuits 36u and 36x drive the switching elements 37u and 37x, respectively. Gate driving circuits 36v and 36y drive the switching elements 37v and 37y, respectively. Gate driving circuits 36w and 36z drive the switching elements 37w and 37z, respectively. The DC power supply 34 and the capacitor 35 are connected between one end (drain node) N1 of each switching element provided in the upper arm and one end (source node) N2 of each switching element provided in the lower arm. A voltage (VPP) is applied between the drain node N1 and the source node N2. Each gate driving circuit appropriately turns on and off the corresponding switching element to generate three-phase (the U-phase, the V-phase, and the W-phase) AC signals with different phases from VPP which is a DC signal. The load 33 is appropriately controlled by the three-phase (the U-phase, the V-phase, and the W-phase) AC signals.

A body diode is provided in the structure of the semiconductor device 1, 1A, 1B, or 1C and a return current can flow through the body diode, without using an inverse parallel diode (freewheeling diode). Therefore, it is possible to reduce the number of components in the inverter device or the size of the inverter device.

The invention made by present inventors has been described in detail above on the basis of the embodiments, the examples, and the modifications. However, the invention is not limited to the embodiments, the examples, and the modifications and it is needless to say that various modifications and changes of the invention can be made without departing from the scope of the invention.

REFERENCE SINGS LIST 1, 1A, 1B, 1C Semiconductor device
10 Semiconductor substrate
11 Drain electrode
12 Epitaxial layer
13 Body region
13' Body region
14 Source region
15 Body contact region
16 JFET region
17 Channel region
18 Gate insulating film
19 Gate electrode
20 Source electrode
21 Hole barrier layer
22 Interlayer insulating film
31 Power conversion device
32 Three-phase inverter device
33 Load
34 DC power supply
35 Capacitor
36u, 36v, 36w, 36x, 36y, 36z Gate driving circuit
37u, 37v, 37w, 37x, 37y, 37z Switching element
A Hole current path during current return operation
A' Electron current path during current return operation
B' Electron current path during current return operation

The invention claimed is:

1. A semiconductor device comprising:
a first-conductivity-type semiconductor substrate;
a first-conductivity-type epitaxial layer that is provided on the first-conductivity-type semiconductor substrate;
a second-conductivity-type body region that is formed in a predetermined portion of a surface of the first-conductivity-type epitaxial layer;
a first-conductivity-type source region that is formed in a predetermined portion of a surface of the second-conductivity-type body region;
a second-conductivity-type body contact region that is provided in a predetermined portion of the surface of the second-conductivity-type body region;
a gate electrode that is formed above the surface of the second-conductivity-type body region which is adjacent to the first-conductivity-type source region or a side surface of the second-conductivity-type body region, with a gate insulating film interposed therebetween;
a source electrode that is formed on the first-conductivity-type source region and the second-conductivity-type body contact region; and
a hole barrier region that is provided between the second-conductivity-type body region and the first-conductivity-type epitaxial layer below the second-conductivity-type body contact region and functions as a potential barrier to a hole which flows from the source electrode to the first-conductivity-type epitaxial layer through the second-conductivity-type body contact region and the second-conductivity-type body region,
wherein the hole barrier region extends from a lower side of the body contact region to a lower side of the source region and does not extend to an end of the body region.

2. The semiconductor device according to claim 1, wherein the hole barrier region is a first conductivity type with a higher impurity concentration than the first-conductivity-type epitaxial layer.

3. The semiconductor device according to claim 1, wherein the gate electrode and the gate insulating film are formed on a side surface of a trench that is formed in a predetermined portion of the surface of the first-conductivity-type epitaxial layer.

4. The semiconductor device according to claim 1, wherein the second-conductivity-type body region is provided below the body contact region so as to extend below the source region, and
the hole barrier region is formed in the body region below the body contact region.

5. The semiconductor device according to claim 1, wherein the first conductivity type is an n type and the second conductivity type is a p type.

6. The semiconductor device according to claim 1, wherein the semiconductor substrate is a SiC substrate.

7. A power conversion device comprising:
the semiconductor device according to claim 1.

8. A semiconductor device comprising:
an $n^+$ SiC substrate;
a drain electrode that is formed on a lower surface of the SiC substrate;
an $n^-$ epitaxial layer that is formed on an upper surface of the SiC substrate;
a p-type body region that is formed in a predetermined portion of a surface of the epitaxial layer;
an $n^+$ source region that is formed in a predetermined portion of a surface of the body region;

a p⁺ body contact region that is formed in a predetermined portion of the surface of the body region;

a gate electrode that is formed above the surface of the body region which is adjacent to the source region or a side surface of the body region, with a gate insulating film interposed therebetween;

a source electrode that is formed on the source region and the body contact region; and an n-type hole barrier region that is provided between the body region and the epitaxial layer below the body contact region and has a higher impurity concentration than the epitaxial layer, wherein the hole barrier region functions as a potential barrier to a hole which flows from the source electrode to the epitaxial layer through the body contact region and the body region, and wherein the hole barrier region extends from a lower side of the body contact region to a lower side of the source region and does not extend to an end of the body region.

9. The semiconductor device according to claim 8, wherein the gate electrode and the gate insulating film are formed on a side surface of a trench that is formed in a predetermined portion of the surface of the epitaxial layer.

10. The semiconductor device according to claim 8, wherein the body region is provided below the body contact region so as to extend below the source region, and the hole barrier region is formed in the body region below the body contact region.

11. A method for manufacturing a semiconductor device, comprising:

(a) a step of preparing a first-conductivity-type SiC substrate;

(b) a step of forming a first-conductivity-type epitaxial layer on the first-conductivity-type SiC substrate;

(c) a step of forming a second-conductivity-type body region in a predetermined portion of a surface of the first-conductivity-type epitaxial layer;

(d) a second-conductivity-type body contact region that is provided in a predetermined portion of the surface of the second-conductivity-type body region;

(e) a step of forming a second-conductivity-type body contact region in a predetermined portion of the surface of the second-conductivity-type body region; and (f) a step of forming a hole barrier region between the second-conductivity-type body region and the first-conductivity-type epitaxial layer below the second-conductivity-type body contact region, wherein, when ion implantation for forming the second-conductivity-type body contact region is performed, second-conductivity-type ion implantation with high energy is added to form the hole barrier region.

12. The method for manufacturing a semiconductor device according to claim 11, wherein, when ion implantation for forming the second-conductivity-type body contact region is performed, said implantation of second-conductivity-type impurity ions is performed in an oblique direction.

* * * * *